(12) United States Patent
Roth

(10) Patent No.: US 9,543,966 B2
(45) Date of Patent: Jan. 10, 2017

(54) HIGH-FREQUENCY SIGNAL GENERATOR WITH LOW PHASE NOISE

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 852 days.

(21) Appl. No.: 13/977,694

(22) PCT Filed: Dec. 13, 2011

(86) PCT No.: PCT/EP2011/072566
§ 371 (c)(1),
(2), (4) Date: Jul. 31, 2013

(87) PCT Pub. No.: WO2012/095230
PCT Pub. Date: Jul. 19, 2012

(65) Prior Publication Data
US 2013/0342277 A1 Dec. 26, 2013

(30) Foreign Application Priority Data
Jan. 12, 2011 (DE) .................. 10 2011 008 350

(51) Int. Cl.
*H03B 21/00* (2006.01)
*H03L 7/06* (2006.01)
(Continued)

(52) U.S. Cl.
CPC ............... *H03L 7/06* (2013.01); *H03B 21/01* (2013.01); *H03B 21/02* (2013.01); *H03D 7/00* (2013.01);
(Continued)

(58) Field of Classification Search
CPC ............ H03B 21/01; H03B 21/02; H03D 7/00
(Continued)

(56) References Cited

U.S. PATENT DOCUMENTS

| 3,378,774 A | 4/1968 | Leypold |
| 4,479,257 A | 10/1984 | Akiyama |

(Continued)

FOREIGN PATENT DOCUMENTS

| DE | 1441883 A1 | 12/1968 |
| DE | 4105566 A1 | 9/1992 |

OTHER PUBLICATIONS

PCT/EP2011/072566, filed: Dec. 13, 2011, International Preliminary Examination Report on Patentability (Date of Mailing: Jul. 18, 2013)(English Translation).

(Continued)

*Primary Examiner* — Arnold Kinkead
(74) *Attorney, Agent, or Firm* — Potomac Technology Law, LLC

(57) ABSTRACT

A high-frequency oscillator comprises a reference-frequency generator and a high-frequency generator. The reference-frequency generator generates a variable reference frequency and supplies it to the high-frequency generator. The high-frequency generator comprises a phase-locked loop and generates a high-frequency signal from the variable reference frequency. The phase-locked loop comprises at least one first mixer, a second mixer and several switches. The first mixer, the second mixer and the switches are connected in series. The mixers are connected into the phase-locked loop individually in a selective manner by means of the switches.

14 Claims, 2 Drawing Sheets

(51) Int. Cl.
  *H03B 21/01*   (2006.01)
  *H03B 21/02*   (2006.01)
  *H03D 7/00*    (2006.01)
  *H03L 7/185*   (2006.01)
  *H03L 7/07*    (2006.01)

(52) U.S. Cl.
  CPC .............. *H03L 7/185* (2013.01); *H03L 7/07* (2013.01); *H03L 2207/10* (2013.01); *H03L 2207/12* (2013.01)

(58) Field of Classification Search
  USPC ............ 455/313; 331/74, 34, 18, 42, 43, 37
  See application file for complete search history.

(56) References Cited

U.S. PATENT DOCUMENTS

| | | | | |
|---|---|---|---|---|
| 4,914,405 | A * | 4/1990 | Wells | H03L 7/20 331/19 |
| 6,960,962 | B2 * | 11/2005 | Peterzell | H03D 3/009 331/25 |
| 7,701,299 | B2 | 4/2010 | Chenakin | |
| 7,928,808 | B2 * | 4/2011 | Chan | H03B 21/02 331/179 |
| 2009/0309665 | A1 | 12/2009 | Chenakin | |
| 2010/0073095 | A1 | 3/2010 | Hirano | |

OTHER PUBLICATIONS

Kroupa, Venceslav, "Noise Properties of PLL Systems", IEEE Transactions on Communications, vol. COM-30, No. 10, Oct. 1982., Oct. 1, 1982.

* cited by examiner

HIGH-FREQUENCY SIGNAL GENERATOR WITH LOW PHASE NOISE

CROSS-REFERENCE TO RELATED APPLICATION(S)

The present application is a national phase application of PCT application No. PCT/EP2011/072566, filed on Dec. 13, 2011, and claims priority to German Patent Application No. DE 102011008350.2, filed on Jan. 12, 2011, the entire contents of which are incorporated herein by reference.

FIELD

Embodiments of the present invention relate to high-frequency signal generators.

BACKGROUND

With conventional signal generators, a reference signal of variable frequency is supplied to a phase-locked oscillator. This is thus excited into oscillation at an adjustable frequency.

Accordingly, DE 41 05 566 A1 discloses a mixer, which synchronizes an oscillator to a clear frequency in the GHz range. This mixer operates with a multiplier diode, which generates a short pulse from the reference frequency, with the line spectrum of which the signal of the oscillator is mixed down. The disadvantage with this method is the poor signal-to-noise ratio which can be achieved with this arrangement. Since the sampling mixer converts on all harmonics of the reference signal, a large amount of noise is also mixed into the intermediate frequency. This restricts the sensitivity.

Moreover, US 2009/0309665 A1 discloses a high-frequency generator which contains a switchable phase-locked loop. Accordingly, the output signal of the oscillator is supplied optionally to a frequency splitter or a series circuit of several mixers. The signal of the frequency splitter is used to adjust the oscillator to a coarse frequency. In order to implement a fine adjustment, the arrangement then switches to the signal of the series-connected mixers. Even with a signal generator according to this design, it is only possible to achieve a sub-optimal phase noise.

Accordingly, there is a need for a high-frequency signal generator, which achieves very good secondary-line spacing with low phase noise.

SUMMARY

Embodiments of the present invention, therefore, advantageously provide for a high-frequency signal generator that achieves improved secondary-line spacing with low phase noise.

According to an example embodiment of the present invention, a signal generator comprises two oscillators locked by means of phase-locked loops. By way of example, a first phase-locked loop generates a high-quality reference frequency, which can be tuned in small, discrete steps over approximately 10% of the frequency. With this restricted frequency range, very good voltage-controlled oscillators can be constructed for the purpose. With the use of a frequency splitter outside the phase-locked loop, the phase noise of an original fixed-frequency reference signal is largely preserved. The comparison frequency is advantageously around >10 MHz, so that rapid frequency changes are possible. Passive doubling units with subsequent filtering are used in order to realize an extremely low-noise operation. As a result of the advantageous filters between the doubling units, undesirable harmonics are suppressed.

To allow the mixing down of the voltage-controlled oscillator to the output frequency with different harmonics of the reference frequency, bridgeable mixers connected in a cascade are used in a further circuit. The output signal of the oscillators can be mixed down with the different reference signals dependent upon the position of the bridging switch. This frequency range can be further increased by using the mirror signal of the first mixer. The resulting intermediate frequency is synchronized with a digital phase detector to a fraction of the reference frequency.

The use of the reference signal as an input signal for the splitter means that crossing mixing products do not occur in the mixers. The mixing products are advantageously disposed on a matrix which corresponds to the last intermediate frequency divided by the resolution of the splitter. Through an appropriate choice of the splitting factors, these mixing products can be selected in such a manner that the mixing products are suppressed by the loop filter and accordingly no secondary lines occur in the synthesizer.

To allow a very rapid frequency change, the oscillator is advantageously pre-tuned. The tuning is based upon an individually measured characteristic of the oscillator.

According to an example embodiment, a signal generator comprises a reference-frequency generator and a high-frequency generator. By way of example, the reference-frequency generator generates a variable reference frequency and supplies it to the high-frequency generator. The high-frequency generator comprises a phase-locked loop and generates a high-frequency signal from the variable reference frequency. The phase-locked loop comprises at least one first mixer, a second mixer and several switches. The first mixer, the second mixer and the switches are connected in series. The mixers are connected into the phase-locked loop individually in a selective manner by the switches. Accordingly, an adjustability of the output frequency is achieved with a very low phase noise.

By way of example, the phase noise can be further reduced by lowpass filters after each mixer.

BRIEF DESCRIPTION OF THE DRAWINGS

The invention is described by way of example in the following paragraphs on the basis of drawings which illustrate advantageous exemplary embodiments of the invention. The drawings show.

DETAILED DESCRIPTION

Figure 1:
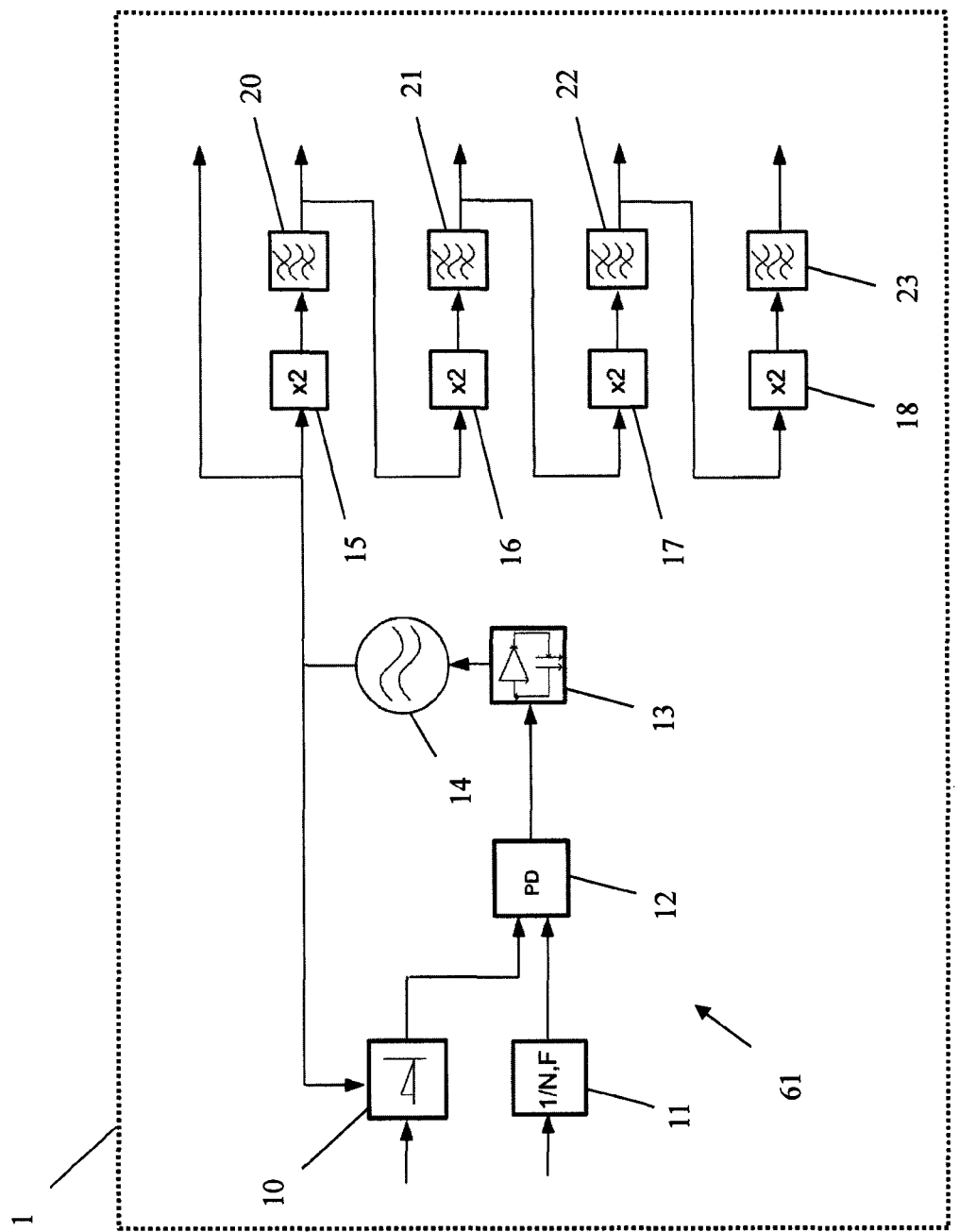
FIG. 1 illustrates a first partial view of a block-circuit diagram of an exemplary embodiment of the oscillator according to the invention.

Initially, with reference to FIG. 1, the structure and method of functioning of a reference-frequency generator is explained. Following this, the function of a high-frequency generator is described with reference to FIG. 2. The presentation and description of identical elements in similar drawings have not been repeated in some cases.

Figure 2:
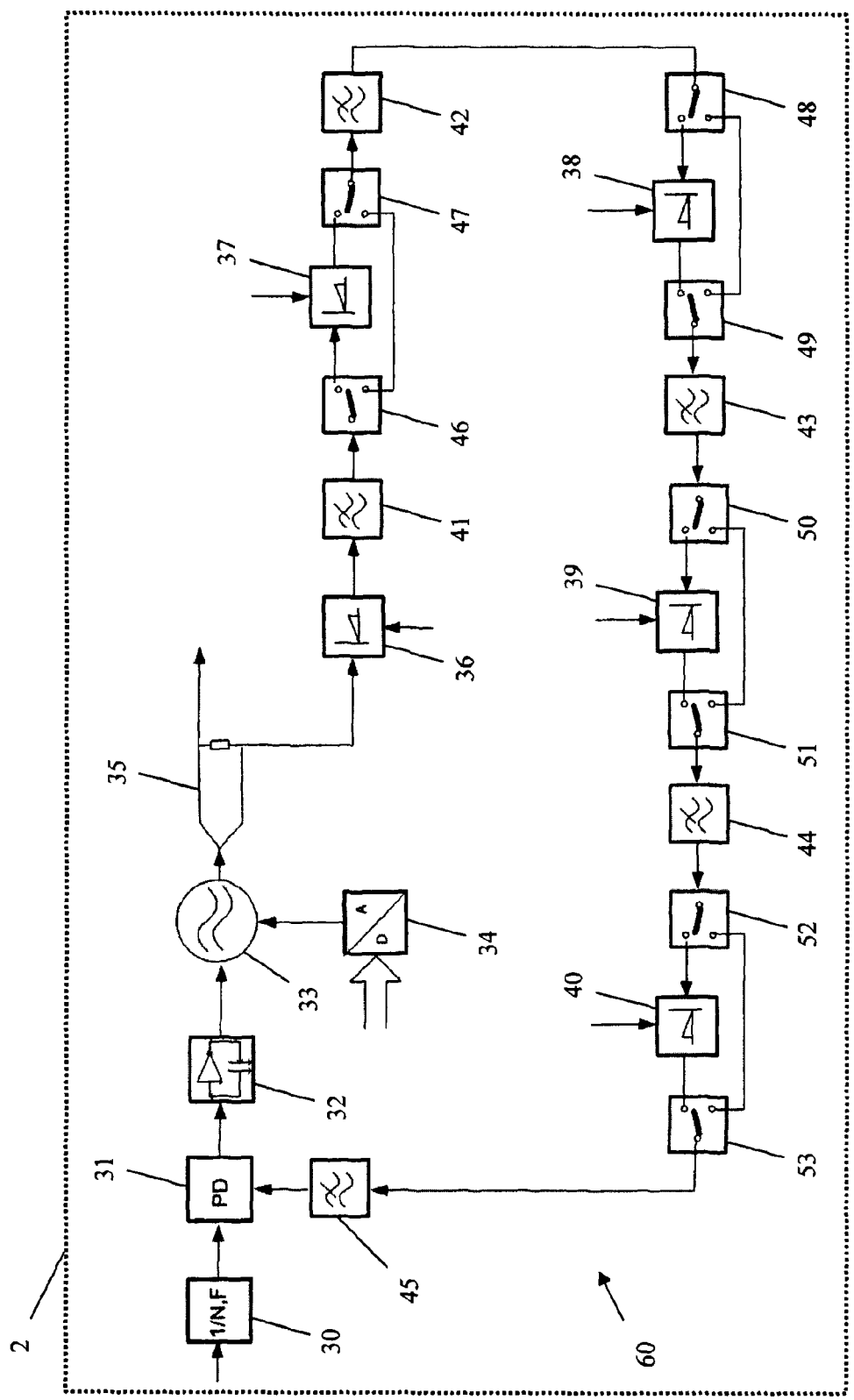
FIG. 2 illustrates a second partial view of a block-circuit diagram of an exemplary embodiment of the oscillator according to the invention.

In FIG. 1 and FIG. 2, an exemplary embodiment of the high-frequency oscillator according to the invention is shown in two different views. A reference generator 1 contains a fractional frequency splitter 11, a phase detector 12, a loop filter 13, a voltage-controlled oscillator 14 and a mixer 10. A stable-frequency reference signal of, for example, 640 MHz, is supplied to the fractional frequency splitter 11. The fractional frequency splitter 11 generates a signal with a frequency divided by $N_{Fref}$ and supplies it to the phase detector 12. The phase detector 12 compares this signal with a signal generated by the mixer 10 and outputs a corresponding output signal to the loop filter 13. This filters the signal and transmits it to the voltage-controlled oscillator 14. This generates an output signal of, for example, 650 MHz-700 MHz and supplies it to the mixer 10 again. The latter mixes this output signal with a stable-frequency reference signal.

In the case of a reference signal of, for example, 640 MHz, an output signal of the mixer of 10 MHz-60 MHz is obtained. The frequency of the output signal of the voltage-controlled oscillator 14 is accordingly adjusted by setting the splitting factor $N_{Fref}$ of the fractional splitter 11.

The reference-frequency generator 1 further comprises several frequency doublers 15, 16, 17, 18, which double the frequency of a connected signal. A bandpass filter 20-23, which in each case allows only the doubled frequency to pass and filters out the other components of the signals, is connected downstream of each frequency doubler 15-18. Accordingly, a reference frequency signal of 650 MHz-700 MHz in the example is present at the output of the voltage-controlled oscillator 14. Accordingly, a doubled reference frequency of 1.3-1.4 GHz is present at the output of the bandpass filter. A quadrupled reference frequency of 2.6-2.8 GHz is present at the output of the bandpass filter 21. An 8-fold reference frequency of 5.2-5.6 GHz is present at the output of the bandpass filter 22. A 16-fold reference frequency of 10.4-11.2 GHz is present at the output of the bandpass filter 23.

The doubled reference frequency of 1.3-1.4 GHz is supplied to a fractional frequency splitter 30 of the high-frequency generator 2. This divides the frequency of the signal by a splitting factor of $N_{Fmain}$. As a result of the low intermediate frequency for the synchronization, a high quality, that is, a very low phase noise is achieved. By multiplying the frequency of the reference signal in small steps with subsequent filtering, a very low phase noise of the reference frequency is achieved.

The output signal of the fractional frequency splitter 30 is supplied to a phase discriminator 31, which compares it with the signal of a phase-locked loop 60 and further routes a corresponding output signal to a loop filter 32. The latter filters the signal and passes it to a voltage-controlled or current-controlled oscillator 33, advantageously an yttrium-iron-garnet (YIG) oscillator. The signal of the loop filter 32 is used for the fine adjustment of the frequency of the controlled oscillator 33.

Furthermore, a signal is supplied from a coarse-control device 34 to the controlled oscillator 33 for a coarse adjustment of its output frequency. The output signal of the voltage-controlled oscillator 33 is supplied to the phase-locked loop 60 via a signal splitter 35. It initially passes through a mixer 36, by which it is mixed with the 16-fold reference frequency. The output signal of the mixer is supplied to a lowpass filter 41, which allows only the lower mixing product to pass. The output signal is supplied to a switch 46, which optionally supplies it to a further mixer 37 or bridges this mixer 37. If the signal is supplied to the mixer 37, it is mixed with the 8-fold reference frequency of 5.2-5.6 GHz in the example. A further switch 47, which, together with the switch 46, implements the switching or the bridging of the mixer 37, is connected to the output of the mixer 37.

The resulting signal is supplied to a further bandpass filter 42 which allows only the lower mixing product of the mixer 37 to pass. If the mixer 37 has been bridged, the lowpass filter 42 plays no role for the signal connected. The output signal is again supplied to a combination of two switches 48, 49, which, like the switches 46, 47 either supply the signal to a further mixer 38 or bridge the latter. If the signal is supplied to the further mixer 38, the latter mixes it with the 4-fold reference frequency of 2.6-2.8 GHz in the example. The output signal is again supplied to a lowpass filter 43, which once again allows only the lower mixing product to pass. Here also, the filter 43 plays no role if the mixer 38 has been bridged.

Further switches 50, 51, a further mixer 39 and a further lowpass filter 44 form another corresponding functional unit. The further mixer 39 mixes with the doubled reference frequency of 1.3-1.4 GHz in the example.

Further switches 52, 53, a further mixer 40 and a further lowpass filter 45 form another corresponding functional unit. The further mixer 40 mixes with an unchanged reference frequency of 650-700 MHz in the example. The signal resulting after the lowpass filter 45 is supplied to the phase discriminator 31.

The signals with which the mixers 36-40 mix the signal of the phase-locked loop 60 are taken from the reference-frequency generator 1. The first mixer 36 can also be advantageously provided with switches. In this case, this mixer can also be bridged. As an alternative, a larger or smaller number of mixers can also be used in the phase-locked loop. The higher the tuning range of the oscillator is supposed to be the more mixers are used.

The phase-locked loop 60 accordingly contains the mixers 36-40, the bandpass filters 41-45, the switches 46-53, the phase discriminator 31 and the loop filter 32.

The following paragraphs explain how the splitting factors $N_{Fref}$ and $N_{Fmain}$ of the fractional splitters 11, 30 are adjusted in order to achieve a desired output frequency of the oscillator.

An output frequency of the oscillator of, for example, 10000 MHz to 18000 MHz is taken as a starting point. Initially, the parameter V, which corresponds to the multiple of the reference frequency $f_{ref}$ with which the mixing down is to be implemented, is calculated. The minimal adjustable reference frequency of 650 MHz in the example and an intermediate frequency of, for example, 55 MHz, which is favorable for the main loop, are used as a basis.

$$V=\text{INT}((f_{osz}+55\text{ MHz})/650\text{ MHz})$$

Following this, the reference frequency $f_{ref}$ is calculated. For this purpose, the previously determined V is used. Since V is rounded down to whole numbers, a reference frequency somewhat higher than 650 MHz is obtained.

$$f_{ref}=(f_{osz}+55\text{ MHz})/V$$

The value of the splitter 11 of the reference-frequency generator is now calculated. The splitting factor $N_{Fref}$ of the reference-frequency generator 1 is rounded in such a manner that no secondary lines occur within the loop bandwidth.

$$N_{Fref}=640\text{ MHz}/\text{ABS}[(640-f_{ref})]$$

with rounding to 1/F with
F=8 for N<20
F=4 for 20≤N<40
F=2 for 40≤N<80
F=1 for 80≤N The rounding to different 1/F prevents the modulation from falling below 8 MHz by a decimal component and accordingly being attenuated by the phase-locked loop.

Following this, the intermediate frequency $f_{zf}$ in the phase-locked loop 60 of the high-frequency generator 2 is calculated. Through the rounding of the splitter 30 in generating the reference frequency $f_{ref}$, an intermediate frequency $f_{zf}$ which differs from the set value is obtained.

$$f_{zf}=V*640 \text{ MHz}*(1-1/N_{Fref})-f_{OSZ}$$

This calculated intermediate frequency $f_{zf}$ is now rounded to an adjustable value.

$$N_{Fmain}=2*640 \text{ MHz}*(1-1/N_{Fref})/f_{zf}$$

with rounding of the splitting factor to 1/F with
F=16 for N<10
F=8 for 10≤N<20
F=4 for 20≤N<40
F=2 for 40≤N<80
F=1 for 80≤N The rounding to different 1/F prevents the modulation from falling below approximately 8 MHz by the decimal component. The resulting secondary lines are accordingly suppressed by the phase-locked loop 60 of the high-frequency generator 1.

Finally, the actual frequency $f_{OSZ}$ of the voltage-controlled oscillator 33 of the high-frequency generator 2 is calculated.

$$f_{OSZ}=V*640 \text{ MHz}*(1-1/N_{Fref})-(2*640 \text{ MHz}*(1-1/N_{Fref})/N_{Fmain})$$

The residual error, which arises from rounding the splitting factors $N_{Fref}$, $N_{Fmain}$, is smaller than 1 MHz and can be tolerated. With the advantageous use of a direct digital synthesizer in the phase-locked loop 60 of the high-frequency oscillator 2 instead of the fractional splitter 30, an arbitrary frequency resolution would be possible.

The invention is not restricted to the exemplary embodiment presented. All of the features described or illustrated in the drawings can be advantageously combined with one another as required within the scope of the invention.

The invention claimed is:

1. A high-frequency oscillator comprising:
   a reference-frequency generator; and
   a high-frequency generator,
   wherein the reference-frequency generator is configured to generate a variable reference frequency and to supply the variable reference frequency at least indirectly to the high-frequency generator,
   wherein the high-frequency generator comprises a phase-locked loop,
   wherein the high-frequency generator is configured to generate a high-frequency signal at least indirectly from the variable reference frequency,
   wherein the phase-locked loop comprises a plurality of mixers, a plurality of switches, and a plurality of lowpass filters, wherein each mixer is associated with one or more of the switches, and a one of the lowpass filters is located after each mixer,
   wherein each mixer and the associated switches are configured in a manner whereby the mixer can be connected into the phase-locked loop individually in a selective manner by means of the switches.

2. The high-frequency oscillator according to claim 1, wherein the phase-locked loop comprises two switches per mixer, configured in a manner whereby, in a first switch position, the switches connect the respective mixer into the phase-locked loop, and, in a second switch position, the switches bypass the respective mixer.

3. The high-frequency oscillator according to claim 1, wherein the reference-frequency generator is further configured to supply the variable reference frequency or an integer multiple of the variable reference frequency to the mixers.

4. The high-frequency oscillators according to claim 1, wherein the reference-frequency generator is further configured to supply the variable reference frequency to a first of the plurality of mixers and a doubled variable reference frequency to a second of the plurality of mixers.

5. The high-frequency oscillator according to claim 1, wherein the phase-locked loop comprises N mixers, and wherein the reference-frequency generator is further configured to supply an $N^2$-fold variable reference frequency to the N mixers, respectively.

6. The high-frequency oscillator according to claim 1, wherein the phase-locked loop comprises N mixers, and one frequency multiplier for each of the N mixers, wherein each frequency multiplier is configured to convert the variable reference frequency to the to an $N^2$-fold variable reference frequency and to supply the $N^2$-fold variable reference frequency to an N-th one of the plurality of mixers.

7. The high-frequency oscillator according to claim 1, wherein the switches of the phase-locked loop are configured whereby at least one mixer is always connected into the phase-locked loop.

8. The high-frequency oscillator according to claim 1, wherein the phase-locked loop further comprises a phase discriminator, wherein the phase discriminator is configured to compare a signal generated by the phase-locked loop with a signal derived from the variable reference frequency ($f_{ref}$).

9. The high-frequency oscillator according to claim 1, wherein:
   the high-frequency generator further comprises one of a voltage-controlled or a current-controlled oscillator, and a coarse control device, and
   the coarse control device is configured to supply a coarse-control signal to the controlled oscillator, and the phase-locked loop is configured to supply a fine-control signal to the controlled oscillator.

10. The high-frequency oscillator according to claim 1, wherein the high-frequency generator further comprises a fractional frequency splitter, wherein the fractional frequency splitter is configured to divide the frequency of a signal derived from the variable reference frequency generated by the reference-frequency generator by a splitting factor.

11. The high-frequency oscillator according to claim 1, wherein the high-frequency generator further comprises a power splitter and a voltage controlled oscillator, wherein the power splitter is configured to supply a part of a high-frequency signal of the voltage-controlled oscillator to the phase-locked loop.

12. The high-frequency oscillator according to claim 1, wherein:
   the reference-frequency generator comprises an oscillator locked by means of a phase-locked loop and a frequency splitter, wherein the frequency splitter is configured to divide a reference signal of fixed frequency with a variable splitting factor and supplies it and to supply the divided reference signal to the phase-locked loop, and
   the frequency of the high-frequency signal is configured to be adjusted by means of the variable splitting factor.

13. The high-frequency oscillator according to claim 12, wherein the reference-frequency generator further comprises at least two frequency doublers and at least two bandpass filters, wherein:

the locked oscillator is connected to a first of the frequency doublers, a first of the bandpass filters is connected to the first frequency doubler, and to a second of the frequency doublers, the second frequency doubler is connected to a second of the bandpass filters, the first bandpass filter is configured to output a doubled reference frequency ($2*f_{ref}$), and the second bandpass filter is configured to output a quadrupled reference frequency ($4*f_{ref}$).

14. The high-frequency oscillator according to claim 1, wherein the reference-frequency generator comprises N series-connected frequency doublers and N associated bandpass filters, wherein each of the N bandpass filters is configured to output an N-fold reference frequency ($N*f_{ref}$).

* * * * *